United States Patent
Soda et al.

[11] Patent Number: 6,103,631
[45] Date of Patent: Aug. 15, 2000

[54] METHOD OF MANUFACTURING SEMICONDUCTOR DEVICE

[75] Inventors: Eiichi Soda; Kazuyoshi Yoshida, both of Tokyo, Japan

[73] Assignee: NEC Corporation, Tokyo, Japan

[21] Appl. No.: 09/211,112

[22] Filed: Dec. 14, 1998

[30] Foreign Application Priority Data

Dec. 15, 1997 [JP] Japan .................................. 9-345217

[51] Int. Cl.⁷ .................................................. H01L 21/00
[52] U.S. Cl. ........................ 438/714; 438/719; 438/721; 438/738
[58] Field of Search .................................. 438/712, 714, 438/719, 721, 723, 724, 734, 738, 743, 744; 216/67, 79

[56] References Cited

U.S. PATENT DOCUMENTS 5,160,407  11/1992  Latchford et al. .................. 438/721 X

FOREIGN PATENT DOCUMENTS

3-141641  6/1991  Japan .
3-215938  9/1991  Japan .
3-241829  10/1991  Japan .
4-294533  10/1992  Japan .
6-29257   2/1994  Japan .

*Primary Examiner*—William Powell
*Attorney, Agent, or Firm*—Hutchins, Wheeler & Dittmar

[57] ABSTRACT

In a semiconductor device manufacturing method, HBr gas (etching gas) is made plasma while the gas pressure thereof is kept to 2 mTorr or less, and ion elements of the plasma are accelerated under bias power of 150 W or more to etch a titanium silicide film 11. Thereafter, HBr gas is further made plasma while the gas pressure thereof is kept to 5 to 10 mTorr, and ion elements of the plasma are accelerated under bias power of 10 to 100 W to etch a polysilicon film 10 with the ion elements in the plasma.

20 Claims, 6 Drawing Sheets

METHOD OF MANUFACTURING SEMICONDUCTOR DEVICE

BACKGROUND OF THE INVENTION

1. Field of the Invention

The present invention relates to a method of manufacturing a semiconductor device and more particularly, to a semiconductor device manufacturing method which has a process of etching a titanium polycide film comprising a polysilicon film and a titanium silicide film which are laminated on a substrate.

2. Description of the Prior Art

Following a high integration design of semiconductor devices, gate electrode materials and wire materials have been required to be further reduced in resistance so that the high-speed operation of integrated circuits can be kept. Low-resistance polysilicon films doped with phosphorus or boron have been hitherto used as materials for gate electrodes and wires, and the recent further progress of the microstructure design of semiconductor devices has increasingly promoted the requirements to further reduce the resistance of the gate electrode materials and wire materials. At present, a metal polycide film comprising a metal silicide film laminated on a polysilicon film has established its position as the mainstream.

The metal polycide film can be very effectively applied to gate electrodes and wires, because techniques which have been hitherto stocked on film formation of a polysilicon and a gate oxide film serving as a base, its chemical stability, workability, and electrical characteristics can be employed for the metal polycide, and the resistance thereof can be reduced.

Figure 6A:
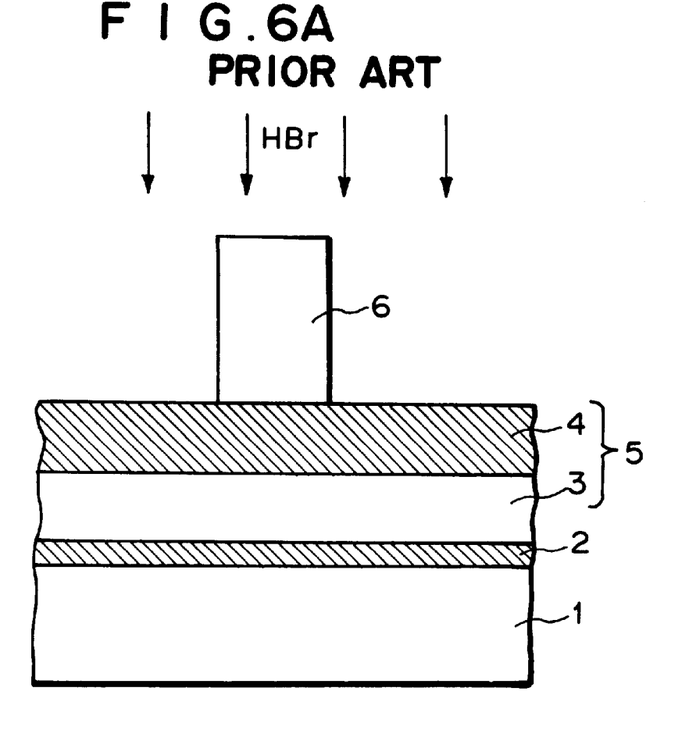
FIGS. 6A and 6B are cross-sectional views showing a method of anisotropically etching the tungsten polycide film in the prior art.
Figure 6B:
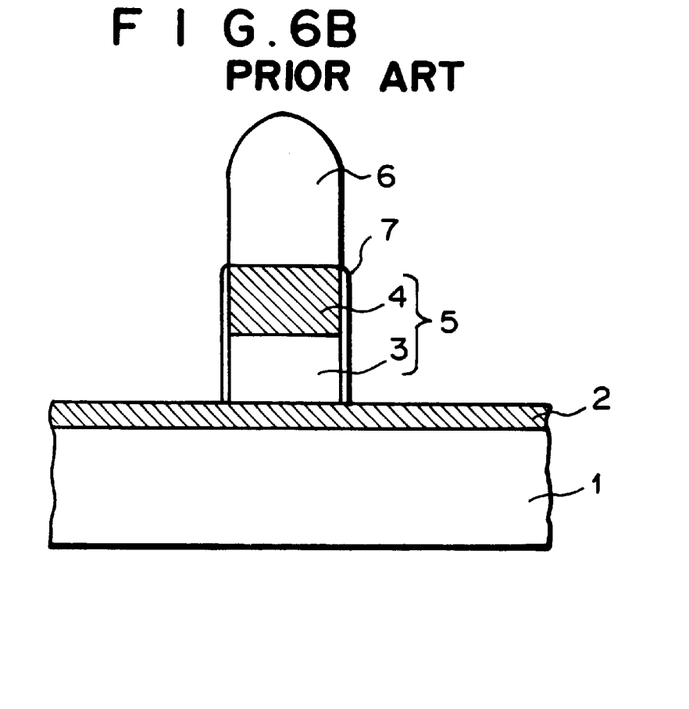

Many etching methods for metal polycide films having a high boiling point have been reported. For example, Japanese Patent Laid-open Publication No. 3-141641 discloses that the etching of metal polycide films can be performed by using HBr alone, and it discloses a method of forming polysilicon film 3 and tungsten suicide film 4 in this order on gate oxide film 2 on silicon substrate 1 to form tungsten polycide film 5, and then etching the tungsten polycide thus formed by accelerating plasma ions with bias power as shown in FIG. 6. In this etching method, a plane parallel plate type RIE (Reactive Ion Etching) apparatus is used as an etching apparatus.

The etching conditions described in the above publication are as follows:

Flow amount of HBr gas: 10 sccm (sccm; standard cubic centimeter per minute)
Gas pressure: 1 Pa (7.5 mTorr)
RF power: 300 W
Etching temperature: 15° C.
Bias voltage (ion accelerating voltage) Vdc: 300 V In the above publication, as shown in FIG. 6A, HBr gas is changed to a plasma state, and ion elements in the plasma are accelerated by bias power applied to the silicon substrate to selectively etch the tungsten polycide film 5 in an area which is not coated with photoresist film 6. Tungsten bromide is promoted to be etched in a sputtering process under a high bias voltage because its vapor pressure is low. In this process, bromine atom (Br) is less reactive than fluorine (F) atom, chlorine atom (Cl), etc., and thus side etching hardly occurs. In addition, as shown in FIG. 6B, unstably-bonded $SiBr_x$ in reaction products due to the etching is reacted with oxygen emitted from a cathode cover ($SiO_2$) appended to the etching apparatus to form side reaction products such as more stable $Si_xO_y$. This side reaction product serves as side wall protection film 7, and thus the side etching is more hardly occur.

The specific resistance of tungsten silicide is equal to about 80 $\mu\Omega$ cm, however, the specific resistance of titanium silicide (TiSi) of metal having high boiling point is equal to about 20 $\mu\Omega$ cm which is equal to one-fourth of the specific resistance of tungsten silicide. Therefore, titanium suicide is more preferably used as metal silicide.

In this connection, Japanese Patent Laid-open Publication No. 6-29257 discloses an example of etching a titanium silicide layer by using a mixture gas of HBr gas and chlorine-based gas ($C_2$, $BCl_3$, HCl or the like).

In the above publication, a magnetron RIE apparatus is used as the etching apparatus. In the etching process, a silicon oxide film or a silicon nitride film is used as a self-alignment mask. The mixture ratio of the HBr gas and the chlorine-based gas is set to a range of 1:1 to 1:9, and the etching is performed under gas pressure of 30 mTorr or less. The HBr gas used in this case contributes to formation of a side wall protection for preventing the titanium silicide layer from the side etching.

However, the prior art disclosed in the Japanese Patent Laid-open Publication No. 6-29257 has a disadvantage that residues are generated or the side etching occurs, when the titanium silicide film is etched by using the mixture gas of HBr and chlorine-based gas such as $Cl_2$. That is, when the composition of a target in a titanium suicide sputtering process is Si rich ($TiSi_{2.4}$), surplus Si aggregates due to a heat treatment after the formation of titanium silicide film, and nodules (small lump) are formed. When the titanium silicide film is afterwards etched by using the mixture gas of HBr gas and chlorine-based gas, the silicon nodule present in the titanium silicide film remains as residues, because there is the following relationship in the etching rate: Ti>$TiSi_2$>Si.

When the mixture gas of HBr gas and chlorine-based gas (for example, $BCl_3$) is used and a photoresist film is used as a mask, some effect is provided to suppress formation of the residues. On the other hand, the film reduction of the photoresist film is great and thus the reaction products of the photoresists adhere to the side wall of the titanium silicide film, so that the pattern width is larger than the design value thereof.

However, the etching condition of tungsten silicide (the technique disclosed in Japanese Patent Laid-open Publication No. 3-141641) cannot be directly applied to titanium silicide that is a high boiling-point metal silicide. This is because there is differences in reactivity between tungsten silicide and titanium silicide about HBr and in vapor pressure between reactive products thereof. That is, with HBr alone, titanium silicide has a higher etching rate and higher reactivity than tungsten silicide. Further, the vapor pressure of the reactive products of each of tungsten silicide and titanium silicide satisfies the following relationship: $SiBr_x$>$TiBr_x$>$WBr_x$, and $TiBr_x$ has a higher vapor pressure than $WBr_x$, so that the side protecting effect due to the volume of the reaction products is less in titanium silicide than tungsten silicide.

Accordingly, if the above etching condition of tungsten silicide is directly applied to titanium silicide, the side etching would be liable to occur, and this is disadvantageous.

Further, in an anneal process to reduce the resistance, It is necessary that a theoretical atom number of silicon to titanium constituting titanium silicide is set to 2 or more in order to stabilize the film resistance after the anneal treatment. In this case, when titanium silicide is subjected to the anneal treatment, nodules (small lumps) due to surplus silicon are generated, and thus the film composition becomes the mixture of two kinds of materials of $TiSi_2$ and silicon nodule. The etching rate is normally different between $TiSi_2$ and the silicon nodule, and thus the residues occur.

SUMMARY OF THE INVENTION

A primary object of the present invention is to provide an anisotropic etching method which induces no residue and no side etching and has excellent dimension controllability in a semiconductor device manufacturing method using a titanium polycide film as a gate electrode or the like.

In order to attain the above object, according to a first aspect of the present invention, a semiconductor device manufacturing method of anisotropically etching a titanium polycide film comprising a polysilicon film and a titanium silicide film laminated on a substrate in this order by plasma of etching gas under a state that bias-power is applied to the substrate, comprises a step of using a etching gas composed of HBr or a mainly HBr-containing gas and making the etching gas plasma while the gas pressure is kept at 2 mTorr or less, and a step of etching the titanium silicide film and the polysilicon film with the plasma while the bias power is kept at 150 W or more.

According to a second aspect of the present invention, a semiconductor device manufacturing method of anisotropically etching a titanium polycide film comprising a polysilicon film and a titanium silicide film laminated on a substrate in this order by plasma of etching gas under a state that bias-power is applied to the substrate, comprises a step of using a first etching gas composed of HBr or a mainly HBr-containing gas and making the first etching gas plasma while the gas pressure thereof is kept at 2 mTorr or less, a step of etching the titanium silicide film with the plasma of the first etching gas while the bias power is kept at 150 W or more, a step of using a second etching gas composed of HBr or a mainly HBr-containing gas and making the second etching gas plasma while the gas pressure thereof is kept in the range of 5 to 10 mTorr, and a step of etching the polysilicon film with the plasma of the second etching gas while the bias power is kept in the range of 10 to 100 W.

According to a third aspect of the present invention, there is provided the semiconductor device manufacturing method according to the second aspect of the present invention, wherein the substrate contains an insulating film formed on a semiconductor substrate.

According to a fourth aspect of the present invention, there is provided the semiconductor device manufacturing method according to the first aspect of the present invention, wherein the etching gas is introduced into a pressure-reducible chamber and a residence time of the first etching gas in the chamber is set to 0.001 to 0.02 second.

According to a fifth aspect of the present invention, there is provided the semiconductor device manufacturing method according to the second aspect of the present invention, wherein at least one of the first etching gas and second etching gas is introduced into a pressure-reducible chamber and a residence time of the etching gas in the chamber is set to 0.001 to 0.02 second.

According to a sixth aspect of the present invention, there is provided the semiconductor device manufacturing method of any one of the first to fifth aspects of the present invention, wherein a silicon oxide film or a silicon nitride film formed on the titanium suicide film is used as a mask in the etching step or in the etching steps.

According to an seventh aspect of the present invention, there is provided the semiconductor device manufacturing method of any one of the first to sixth aspects of the present invention, wherein the substrate temperature in the etching step is set to 60° C. or less.

The inventor has found out such a phenomenon that in the case a titanium silicide is etched with HBr gas, the difference in etching rate among Ti, $TiSi_2$ and Si can be reduced by reducing the gas pressure and increasing the bias power applied to the substrate. This phenomenon may be considered as being caused by the following mechanism. The mean free path of ions can be lengthened by reducing the gas pressure thereby enhancing the anisotropy and also, the incidence energy of ions is increased by increasing the bias power to forcedly remove silicon nodules.

Further, comparing the reactivity between $TiSi_2$ and Br radical and the temperature dependence of the reactivity between Si and Br radical, $TiSi_2$ has higher temperature dependence than Si and thus the difference in etching rate between $TiSi_2$ and Si is more remarkable at high temperature. Therefore, as the etching temperature is reduced, occurrence of the residues is suppressed more greatly.

The present invention has been implemented in consideration of the above experimental result. Specifically, according to an aspect of the present invention, a etching gas which is composed of HBr gas or a mainly HBr-containing gas is made plasma under a low pressure (2 mTorr or less), and plasma ions thus generated are accelerated under a high bias power (150 W or more) to etch the titanium polycide film. Therefore, the difference in etching rate between $TiSi_2$ and the silicon nodule is reduced. As a result, the residues occurring in the etching process can be reduced.

The reactivity between $TiSi_2$ and Br is relatively high, however, the anisotropic characteristic of the etching can be enhanced by accelerating the ions under the low gas pressure (2 mTorr or less) and under the high bias power (150 W or more), whereby the side etching is suppressed. Further, by reducing the etching temperature (or substrate temperature), the side etching can be further suppressed. The etching temperature is preferably set to 60° C. or less.

Further, according to another aspect of the present invention, the ions are first accelerated under low gas pressure (2 mTorr or less) and high bias power (150 W or more) to etch the upper layer portion (the layer containing a polysilicon film) of a titanium polycide, and then the ions are accelerated under relatively high gas pressure (5 to 10 mTorr) and low bias power (10 to 100 W) to etch the remaining polysilicon film.

This two-step etching process is more effectively applied particularly when the base of the titanium polycide film is an insulating film such as a silicon oxide or the like. That is, the titanium silicide film is etched under the low gas pressure and the high bias power to suppress occurrence of the residues, and then the remaining polysilicon film is etched under the high gas pressure and the low bias power to keep the high selection ratio between the polysilicon film and the insulating film serving as the base, whereby over-etching is suppressed.

DETAILED DESCRIPTION OF THE DRAWINGS

A preferred embodiment according to the present invention will be described hereunder with reference to the accompanying drawings.

Figure 1A:
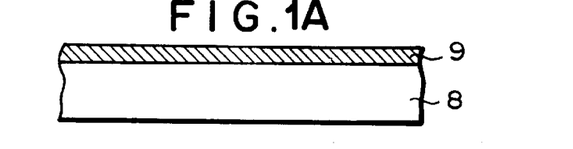
FIGS. 1A to 1E are cross-sectional views showing a film forming process in the step sequence according to embodiment of the present invention.
Figure 1B:
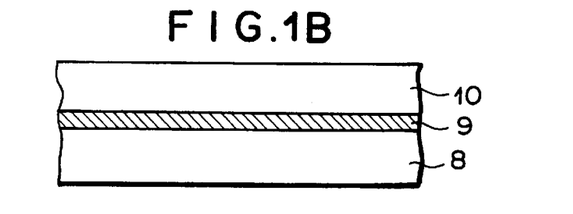
Figure 1C:
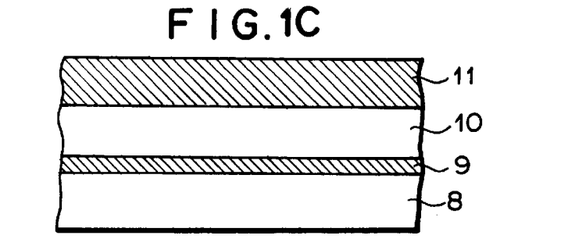
Figure 1D:
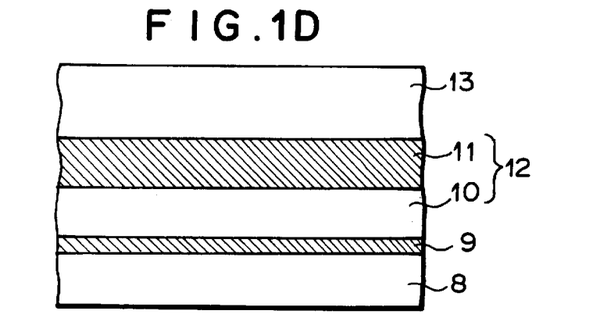
Figure 1E:
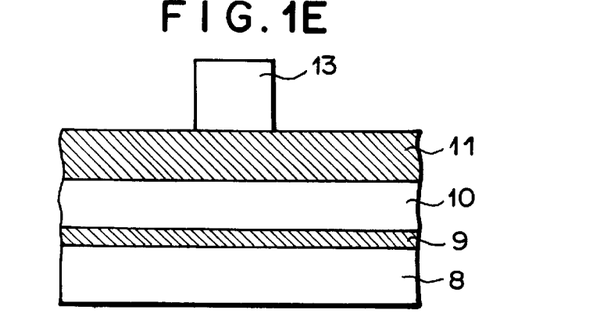
Figure 2A:
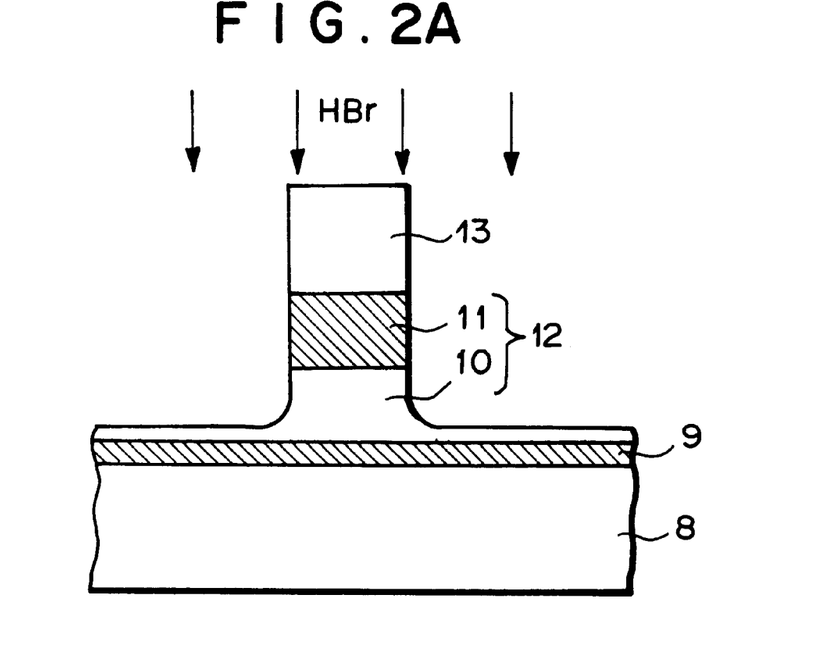
FIGS. 2A and 2B are cross-sectional views showing an etching method according to the embodiment of the present invention.
Figure 2B:
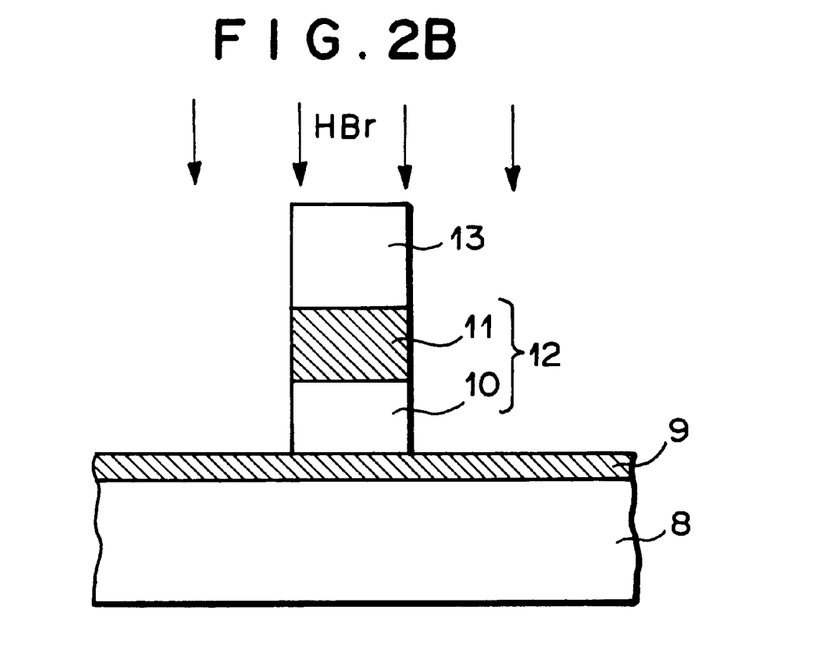

FIGS. 1A to 1E are cross-sectional views showing a film forming process according to the embodiment of the present invention, and FIGS. 2A and 2B are cross-sectional views showing an etching method according to the embodiment.

Figure 7:
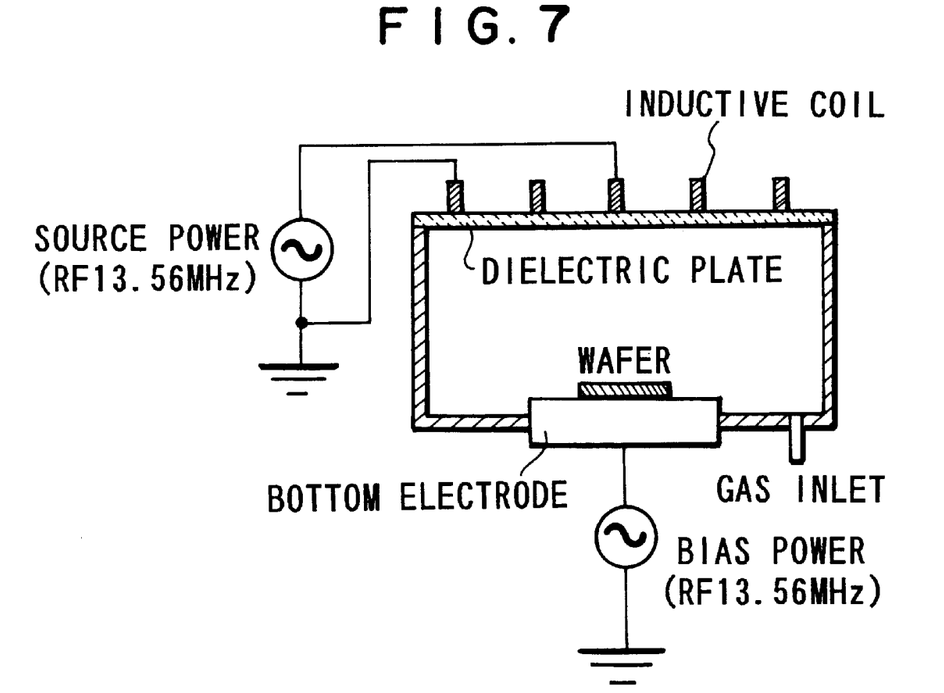
FIG. 7 is a diagram showing an etching apparatus used for the embodiment of the present invention.

This embodiment relates to a method of etching a titanium polycide film formed on a silicon substrate (or semiconductor substrate) with plasma of HBr gas by two steps to form gate electrodes, wires or the like. That is, according to this embodiment, in a first etching step, HBr gas (a first etching gas) is made plasma while being kept at a low pressure (substantially 2 mTorr) and then the plasma thus generated is accelerated by applying high bias power (substantially 150 W)to etch the upper layer portion (titanium silicide film) of the titanium polycide film at a low temperature (substantially 20° C.). Thereafter, in a second etching step, HBr gas (a second etching gas) is made plasma while being kept at a relatively high pressure (substantially 5 mTorr), and then the plasma thus generated is accelerated by applying low bias power (substantially 50 W) to etch the lower layer portion (polysilicon film) of the titanium polycide film at a low temperature (substantially 20° C.). FIG. 7 is a diagram showing an etching apparatus used in this embodiment.

This embodiment will be described in more detail with reference to FIGS. 1A to 1E and FIGS. 2A and 2B.

First, as shown in FIG. 1A, gate oxide film (silicon oxide film) 9 having a thickness of substantially 7 nm is formed on silicon substrate 8 by thermal oxidation. Subsequently, polysilicon film 10 having a thickness of substantially 100 nm is deposited on the gate oxide film 9 by a CVD (Chemical Vapor Deposition) method (FIG. 1B). Subsequently, titanium suicide film 11 having a thickness of substantially 100 nm is deposited on the polysilicon film 10 by a sputtering method (FIG. 1C), whereby a titanium polycide film 12 is formed.

Next, in order to reduce the resistance of titanium polycide film 12, a thermal treatment is performed under a temperature atmosphere of 800 to 950° C., preferably 850° C. Here, when the composition of a target in the sputtering process of titanium silicide film 11 is Si rich (TiSi$_{2.4}$); surplus Si agglomerates due to the thermal treatment and nodules are formed. Therefore, it is important to carry out the heat treatment after the formation of titanium silicide film 11 and before the etching is carried out. This is because if the heat treatment is carried out after the etching process, the dispersion of the wiring resistance of titanium silicide film 11 is increased.

After the heat treatment, silicon oxide film 13 is formed on the titanium silicide film 11 (FIG. 1D), and then a patterning treatment to form an oxide film mask 13 is carried out (FIG. 1E).

Subsequently, titanium polycide film 12 is etched by using silicon oxide film 13 as a self-alignment mask. This etching processing is performed by two steps, and for example, these two etching steps are continuously performed by using an inductive coupling type plasma etching apparatus while silicon substrate 8 is placed on a plasma generating electrode in a pressure-reducible chamber. Here, in each etching step, the control of the plasma density is performed by adjusting the source power to be applied to the plasma generating electrode, and the control of incidence energy of the ions is performed by adjusting the bias power applied to silicon substrate 8.

The residence time of the HBr gas (the first and second etching gas) in the chamber is set to 0.001 to 0.02 second. The residence time of the HBr gas in the chamber is determined by the volume of the chamber, the discharge rate in the chamber, the gas pressure in the chamber, the flow amount of the etching gas introduced into the chamber, etc. The residence time of the HBr gas in the chamber is set to 0.001 to 0.02 second for the following reason. If the HBr gas stays in the chamber over 0.02 second, reaction products such as Ti$_x$Br$_x$, Si$_x$Br$_y$, etc. adhere to the side wall of titanium polycide film 12 in the etching, and these reaction products adhering to the side wall serve as masks to lower the dimensional precision of the patterning of gate electrodes, etc. On the other hand, if the residence time is set to be shorter than 0.001 second, the time required for the etching treatment is long.

In the first etching step, the overall titanium silicide film 11 and a part of the polysilicon film 10 are etched (FIG. 2A).

Preferable etching conditions for the first etching step is as follows:

| | |
|---|---|
| Gas pressure | substantially 2 mTorr |
| Source power | substantially 250 W |
| Bias power | substantially 150 W |
| HBr flow amount | substantially 50 sccm |
| Substrate temperature | substantially 20° C. |

In the second etching step, the remaining portion of polysilicon film 10 which is not removed in the first etching step is etched and the surface portion of gate oxide film 9 is over-etched (FIG. 2B). With the above two-step etching process, gate electrodes or wires comprising titanium polycide film 12 are completed (FIG. 2B).

Preferable etching conditions for the second etching step is as follows:

| | |
|---|---|
| Gas pressure | substantially 5 mTorr |
| Source power | substantially 200 W |
| Bias power | substantially 50 W |
| HBr flow amount | substantially 130 sccm |
| Substrate temperature | substantially 20° C. |

According to this embodiment, in the first etching step, ions are accelerated under low gas pressure (substantially 2 mTorr) and high bias power (substantially 150 W) to anisotropically etch the upper layer portion (the layer containing the polysilicon film 10) of titanium polycide film 12 thereby suppressing the formation of residues and side etching. Further, in the second etching step, ions are accelerated under relatively high gas pressure (substantially 5 mTorr) and low bias power (substantially 50 W) to etch the remaining polysilicon film 10, whereby the high selective ratio between polysilicon film 10 and gate oxide film 9 serving as the base is kept. Therefore, the over-etching can be reduced.

Accordingly, the above two-step etching process is more effectively applied to the case the base of titanium polycide film 12 is an insulating film such as gate oxide film 9 or the like.

In the above two-step etching process, gate oxide film 9 is used as the self-alignment mask, so that a high patterning dimensional precision can be ensured. Further, since the residence time of the HBr gas (the first and second etching gas) in the chamber is set to 0.001 to 0.02 second, the reaction produces such as $Ti_xBr_y$, $Si_xBr_y$, etc. never adhere to the side walls of the titanium polycide film 12, and thus higher patterning dimensional precision can be ensured.

The above preferably etching conditions have been achieved on the basis of the etching experiments that were made on titanium polycide film 12 by the inventor.

Figure 3:
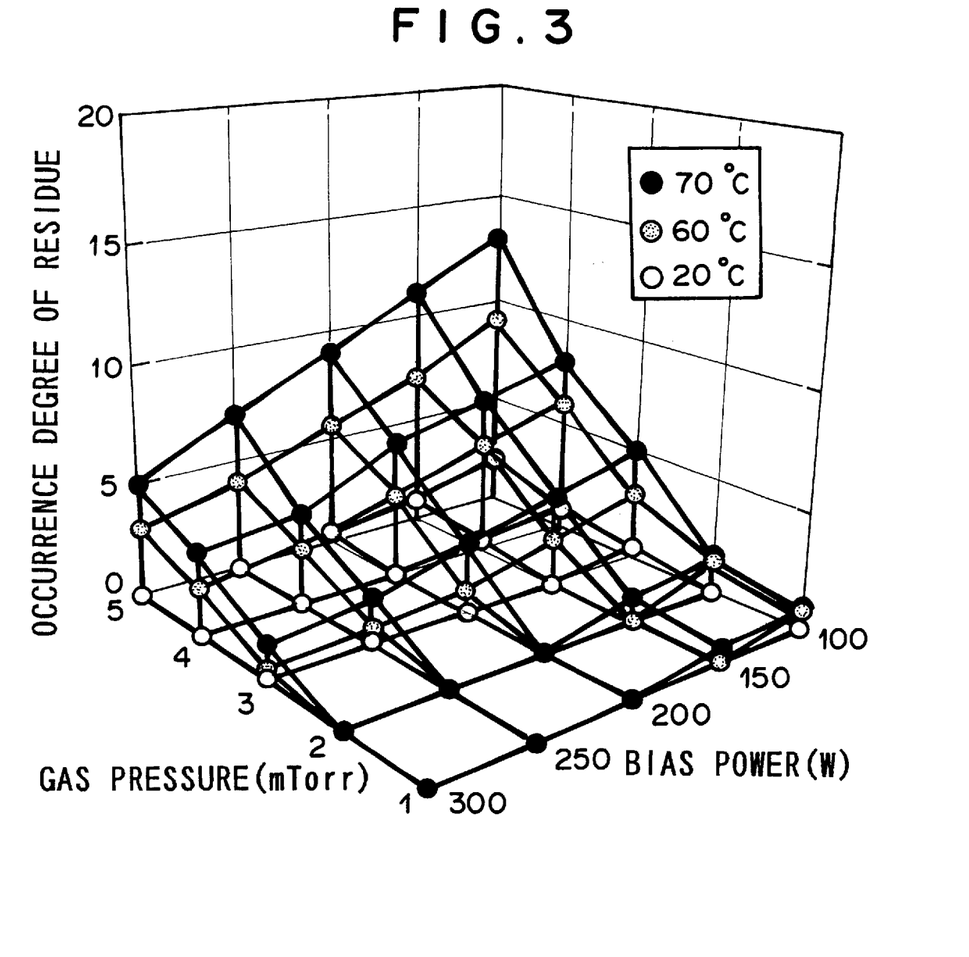
FIG. 3 is a graph showing an etching experimental result which supports the effect of the embodiment of the present invention and shows the occurrence degree of residues with respect to gas pressure (mTorr), bias power (W) and temperature (° C.)

FIG. 3 is a graph showing an etching experiment result supporting the effect of this embodiment, and it shows the occurrence degree of residues with respect to the gas pressure (mTorr), the bias power (W) and the temperature (° C.).

Under a normal etching condition, there is satisfied the following relationship of from large value to small value in the etching rate: Ti>TiSi$_2$>Si, and thus the silicon nodules existing in the titanium silicide film 11 cause the residues. However, it is apparent from the graph of FIG. 3 that the lower the gas pressure, the higher the bias power or the lower the etching temperature, the smaller the occurrence degree of the residues is. If the gas pressure is reduced, the mean free path of ions is lengthened and thus the etching anisotropy can be enhanced. Further, if the bias power is increased, the incident energy of the ions is increased, and thus the silicon nodules can be forcedly removed.

Further, the occurrence degree of the residues can be reduced by lowering the etching temperature for the following reason. When comparing the temperature dependence of the reactivity between TiSi$_2$ and Br radical and the reactivity between Si and Br radical, TiSi$_2$ has a larger temperature dependence of reactivity than Si. Therefore, at a high temperature, the difference in etching rate between TiSi$_2$ and Si is more remarkable, however, at a low temperature the different in etching rate is reduced.

As show in FIG. 3, the occurrence of residues can be substantially prevented if the gas pressure is set to 2 mTorr or less and the bias power is set to 150 W or more. Further, the etching temperature is preferably set to 60° C. or less.

It is preferable that the gas pressure is lower. However, if it is excessively low, it is difficult to regulate the gas pressure, and thus the gas pressure is preferably set to 0.5 mTorr or more. Further, it is preferable that the bias power is higher. However, it is generally preferably set to 300 W or less in consideration of a manufacturing restriction of the apparatus, etc. Still further, it is preferable that the etching temperature is lower. However, if the temperature is excessively low, it promotes adhesion of the reaction products to change the etching shape, and thus the etching temperature is preferably set to −10° C. or more, more suitably 20° C. or more.

Figure 4:
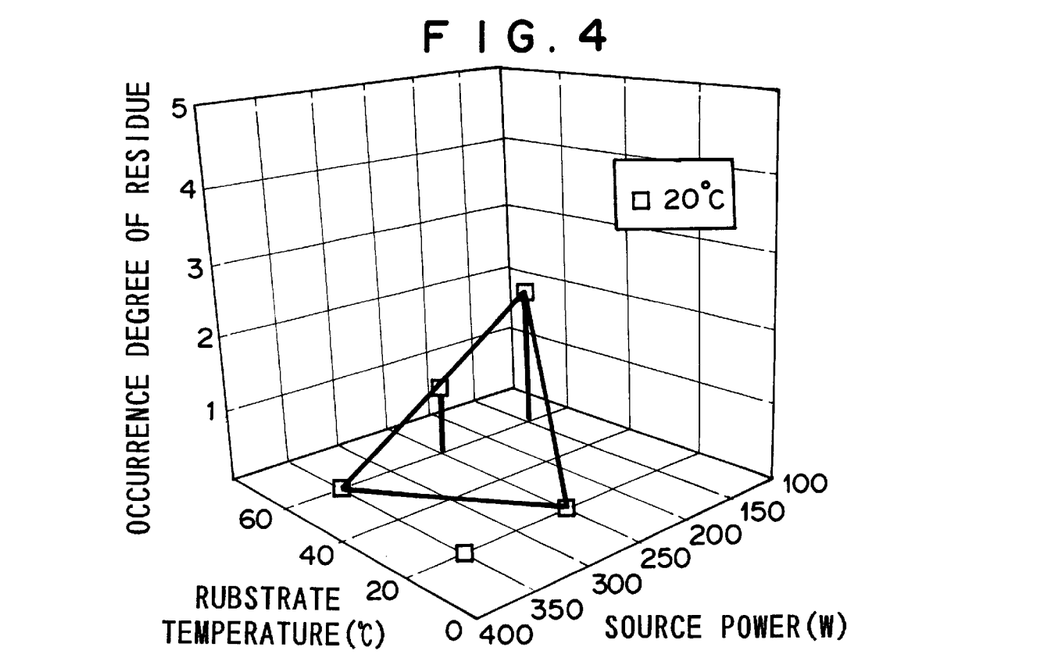
FIG. 4 is a graph showing another etching experimental result which supports the effect of the embodiment of the present invention and shows the occurrence degree of residues with respect to source power (W) and substrate temperature (° C.)

Next, FIG. 4 is a graph showing the occurrence degree of residues with respect to the source power (W) and the substrate temperature (° C.). According to the graph of FIG. 4, as the source power is increased, the ion density is more increased, and the probability that the residues are removed by the sputtering is increased.

According to the experiments, under the low gas pressure (2 mTorr or less), the high bias power (150 W or more) and the low temperature (60° C. or less ) under which no residue occurs, no side etching occurs in the titanium silicide film 11. However, when such a condition is applied to the over-etching process after the polysilicon film 10 of the lower layer and gate oxide film 9 are exposed, silicon substrate 8 is damaged because the etching reaches silicon substrate 8.

Figure 5:
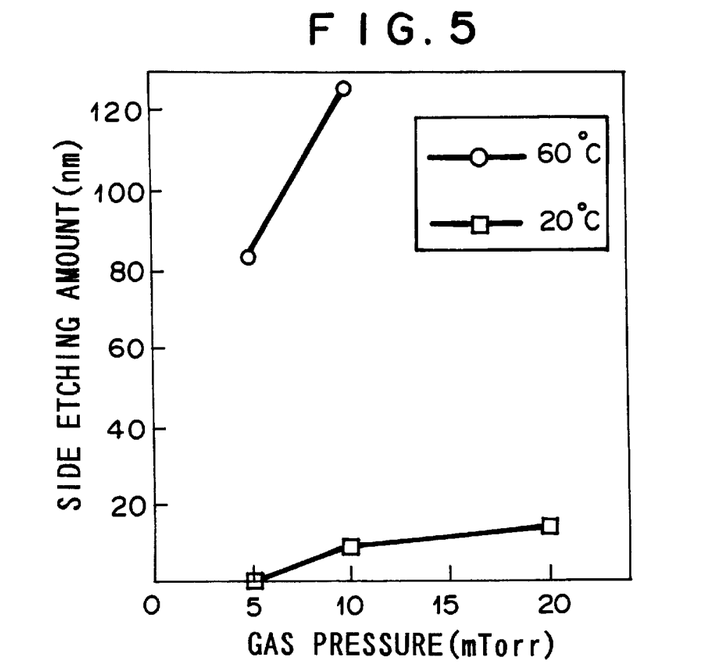
FIG. 5 is a graph showing another etching experimental result which supports the effect of the embodiment of the present invention and shows the relationship of the side etching amount, the gas pressure and the substrate temperature for the polysilicon film.

FIG. 5 is a graph showing the relationship among the side etching amount, the gas pressure and the substrate temperature for polysilicon film 10. As is apparent from FIG. 5, as the substrate temperature is increased, it is more difficult to form a side wall protection film, and the reactivity between TiSi$_2$ and Br is higher, so that the side etching amount is increased. However, if the substrate temperature is low, the side-etching amount can be reduced.

Further, as the gas pressure is reduced, the straight-ahead travel of ions is enhanced, resulting in enhancement of the etching anisotropy, so that the side etching can be suppressed. Under the gas pressure of 5 mTorr, the selective ratio of polysilicon film 10 to gate oxide film 9 is equal to 94, and a high selective ratio is obtained. However, if the gas pressure is lower than 5 mTorr, the selective ratio of the etching between polysilicon film 10 and gate oxide film 9 is reduced.

As described above, the suitable etching condition for titanium silicide film 11 constituting the upper layer of titanium polycide film 12 is different from the suitable etching condition for polysilicon film 10 constituting the lower layer of titanium polycide film 12, and thus it is preferable to perform the etching process at the two steps.

Therefore, according to this embodiment, in the first etching step the ions are accelerated under the low gas pressure (substantially 2 mTorr) and the high bias power (substantially 150 W) to anisotropically etch the upper layer portion of titanium polycide film 12 (the layer containing polysilicon film 10 ), then in the second etching step the ions are accelerated under the relatively high gas pressure (substantially 5 mTorr) and the low bias power (substantially 50 W) to etch the remaining polysilicon film 10, and then the over-etching is carried out on the surface layer portion of gate oxide film 9.

The above etching condition is one of suitable conditions, and it is apparent from the foregoing description that the present invention is not limited to the above condition.

That is, as is apparent from FIGS. 3 to 5, in the first etching step, HBr gas (first etching gas) is made plasma while being kept at the low pressure (2 mTorr or less), and the plasma thus generated is accelerated with the high bias power (150 W or more) to etch the upper layer (titanium silicide film) portion of the titanium polycide film at the lower temperature (60° C. or less), and then in the second etching step, HBr gas (second etching gas) is made plasma while being kept at the relatively high pressure (5 to 10 mTorr) and the plasma thus generated is accelerated with the low bias power (10 to 100 W) to etch the lower layer (polysilicon film) portion of the titanium polycide film at the lower temperature (60° C. or less), whereby the same effect as described above can be obtained.

The specific construction of the present invention is not limited to the above embodiment, and various modifications or alterations in design may be contained in the present invention insofar as they do not depart from the subject matter of the present invention. For example, a gate nitride film (silicon nitride film) may be used in place of the gate oxide film (silicon oxide film) 9.

Further, in the above embodiment, the two-step etching process is carried out. However, if the base of titanium polycide film 12 is not an insulating film such as gate oxide film 9 or the like, the anisotropic etching may be performed under the same etching condition.

That is, with using etching gas which is composed of HBr gas or mainly contains HBr gas, the etching gas is made plasma while keeping the gas pressure at 2 mTorr or less, and the titanium silicide film and the polysilicon film are continuously etched while keeping the bias power at 150 W or more.

Mixture gas of HBr gas containing Ar, $N_2$ or $O_2$ may be used as the etching gas that mainly contains HBr gas, for example.

As described above, according to an aspect of the present invention, the etching gas which is composed of HBr gas or mainly contains HBr gas is made plasma while kept at the low pressure (2 mTorr or less), and the plasma ions thus generated are accelerated by the high bias power (150 W or more) to etch the titanium polycide film, so that the difference in etching rate between $TiSi_2$ and silicon nodules is reduced. Therefore, the residues generated in the etching process can be further reduced.

Further, the reactivity between $TiSi_2$ and Br is relatively high, however, the ions are accelerated under the low gas pressure (2 mTorr or less) and the high bias power (150 W or more), so that the anisotropic characteristic of the etching can be enhanced and thus the side etching can be further suppressed.

According to another aspect of the present invention, in the first etching step, the ions are first accelerated under the low gas pressure (2 mTorr or less) and the high bias power (150 W or more) to etch the upper layer portion (the layer containing the polysilicon film) of the titanium polycide film, and then in the second etching step, the ions are accelerated under the relatively high gas pressure (5 to 10 mTorr) and the low bias power (10 to 100 W) to etch the remaining polysilicon film. Particularly when the base of the titanium polycide film is an insulating film of the silicon oxide film or the like, this two-step etching process is more effective. That is, the generation of the residues can be suppressed by etching the titanium silicide film under the low gas pressure and the high bias power, and the high selective ratio between the polysilicon film and the insulating film serving as the base can be maintained by etching the remaining polysilicon film under the high gas pressure and the low bias power, so that the over-etching can be suppressed.

What is claimed is:

1. A semiconductor device manufacturing method of anisotropically etching a titanium polycide film comprising a polysilicon film and a titanium silicide film laminated on a substrate in this order by plasma of etching gas under a state that bias-power is applied to the substrate, comprising steps of:
    (a) using a etching gas composed of HBr or a mainly HBr- containing gas and making the etching gas plasma at a gas pressure of at most 2 mTorr; and
    (b) etching the titanium silicide film and the polysilicon film with the plasma with a bias power of at least 150 W.

2. A semiconductor device manufacturing method of anisotropically etching a titanium polycide film comprising a polysilicon film and a titanium silicide film laminated on a substrate in this order by plasma of etching gas under a state that bias-power is applied to the substrate, comprising steps of:
    (a) using a first etching gas composed of HBr or a mainly HBr- containing gas and making the first etching gas plasma at a gas pressure of at most 2 mTorr;
    (b) etching a titanium silicide film with the plasma of the first etching gas with a bias power of at least 150 W;
    (c) using a second etching gas composed of HBr or a mainly HBr- containing gas and making the second etching gas plasma while the gas pressure thereof is kept in the range of 5 to 10 mTorr; and
    (d) etching the polysilicon film with the plasma of the second etching gas while the bias power is kept in the range of 10 to 100 W.

3. The semiconductor device manufacturing method as claimed in claim 2, wherein the substrate contains an insulating film formed on a semiconductor substrate.

4. The semiconductor device manufacturing method as claimed in claim 1, wherein the etching gas is introduced into a pressure-reducible chamber, and a residence time of the etching gas in the chamber is set to 0.001 to 0.02 second.

5. The semiconductor device manufacturing method as claimed in claim 2, wherein the first etching gas is introduced into a pressure-reducible chamber, and a residence time of the first etching gas in the chamber is set to 0.001 to 0.02 second.

6. The semiconductor device manufacturing method as claimed in claim 2, wherein the second etching gas is introduced into a pressure-reducible chamber, and a residence time of the second etching gas in the chamber is set to 0.001 to 0.02 second.

7. The semiconductor device manufacturing method as claimed in claim 1, wherein a silicon oxide film formed on the titanium silicide film is used as a mask in the etching step.

8. The semiconductor device manufacturing method as claimed in claim 1, wherein a silicon nitride film formed on the titanium silicide film is used as a mask in the etching step.

9. The semiconductor device manufacturing method as claimed in claim 2, wherein a silicon oxide film formed on the titanium silicide film is used as a mask in the etching steps.

10. The semiconductor device manufacturing method as claimed in claim 2, wherein a silicon nitride film formed on the titanium silicide film is used as a mask in the etching steps.

11. The semiconductor device manufacturing method as claimed in claim 1, wherein the substrate temperature in the etching step is less than or equal to 60° C.

12. The semiconductor device manufacturing method as claimed in claim 2, wherein the substrate temperature in the etching step is less than or equal to 60° C.

13. The semiconductor device manufacturing method as claimed in claim 3, wherein the substrate temperature in the etching step is less than or equal to 60° C.

14. The semiconductor device manufacturing method as claimed in claim 4, wherein the substrate temperature in the etching step is less than or equal to 60° C.

15. The semiconductor device manufacturing method as claimed in claim 5, wherein the substrate temperature in the etching step is less than or equal to 60° C.

16. The semiconductor device manufacturing method as claimed in claim 6, wherein the substrate temperature in the etching step is less than or equal to 60° C.

17. The semiconductor device manufacturing method as claimed in claim 7, wherein the substrate temperature in the etching step is less than or equal to 60° C.

18. The semiconductor device manufacturing method as claimed in claim 8, wherein the substrate temperature in the etching step is less than or equal to 60° C.

19. The semiconductor device manufacturing method as claimed in claim 9, wherein the substrate temperature in the etching step is less than or equal to 60° C.

20. The semiconductor device manufacturing method as claimed in claim 10, wherein the substrate temperature in the etching step is less than or equal to 60° C.

* * * * *